(12) United States Patent
Park et al.

(10) Patent No.: US 8,747,948 B2
(45) Date of Patent: Jun. 10, 2014

(54) DEPOSITION APPARATUS

(75) Inventors: Hyung Sang Park, Seoul-si (KR); Seung Woo Choi, Cheonan-si (KR); Jong Su Kim, Cheonan-si (KR); Dong Rak Jung, Cheonan-si (KR); Jeong Ho Lee, Seoul-si (KR); Chun Soo Lee, Daejeon-si (KR)

(73) Assignee: ASM Genitech Korea Ltd. (KR)

( * ) Notice: Subject to any disclaimer, the term of this patent is extended or adjusted under 35 U.S.C. 154(b) by 53 days.

(21) Appl. No.: 13/346,470

(22) Filed: Jan. 9, 2012

(65) Prior Publication Data

US 2012/0114856 A1     May 10, 2012

Related U.S. Application Data

(62) Division of application No. 12/334,135, filed on Dec. 12, 2008, now Pat. No. 8,092,606.

(30) Foreign Application Priority Data

Dec. 18, 2007 (KR) .................. 10-2007-0133428

(51) Int. Cl.
    *C23C 16/00*     (2006.01)
(52) U.S. Cl.
    USPC .................................................. 427/255.28
(58) Field of Classification Search
    CPC .............................. C23C 16/04; C23C 16/458
    See application file for complete search history.

(56) References Cited

U.S. PATENT DOCUMENTS

| | | |
|---|---|---|
| 3,627,590 A | 12/1971 | Mammel |
| 4,261,762 A | 4/1981 | King |
| 4,313,783 A | 2/1982 | Davies et al. |
| 4,403,567 A | 9/1983 | daCosta et al. |
| 4,457,359 A | 7/1984 | Holden |
| 4,458,746 A | 7/1984 | Holden et al. |
| 4,508,161 A | 4/1985 | Holden |
| 4,512,391 A | 4/1985 | Harra |
| 4,522,697 A | 6/1985 | Dimock et al. |
| 4,523,985 A | 6/1985 | Dimock |
| 4,527,620 A | 7/1985 | Pedersen et al. |
| 4,535,834 A | 8/1985 | Turner |
| 4,535,835 A | 8/1985 | Holden |

(Continued)

FOREIGN PATENT DOCUMENTS

| | | |
|---|---|---|
| EP | 0 448 346 | 9/1991 |
| EP | 0 452 779 | 10/1991 |

(Continued)

*Primary Examiner* — David Turocy
*Assistant Examiner* — Michael G Miller
(74) *Attorney, Agent, or Firm* — Knobbe, Martens, Olson & Bear, LLP (57) ABSTRACT

A deposition apparatus configured to form a thin film on a substrate includes: a reactor wall; a substrate support positioned under the reactor wall; and a showerhead plate positioned above the substrate support. The showerhead plate defines a reaction space together with the substrate support. The apparatus also includes one or more gas conduits configured to open to a periphery of the reaction space at least while an inert gas is supplied therethrough. The one or more gas conduits are configured to supply the inert gas inwardly toward the periphery of the substrate support around the reaction space. This configuration prevents reactant gases from flowing between a substrate and the substrate support during a deposition process, thereby preventing deposition of an undesired thin film and impurity particles on the back side of the substrate.

10 Claims, 7 Drawing Sheets

(56) References Cited

U.S. PATENT DOCUMENTS

| | | | |
|---|---|---|---|
| 4,537,244 | A | 8/1985 | Holden |
| 4,542,298 | A | 9/1985 | Holden |
| 4,565,601 | A | 1/1986 | Kakehi et al. |
| 4,567,938 | A | 2/1986 | Turner |
| 4,603,466 | A | 8/1986 | Morley |
| 4,654,509 | A | 3/1987 | Robinson et al. |
| 4,709,655 | A | 12/1987 | Van Mastrigt |
| 4,724,621 | A | 2/1988 | Hobson et al. |
| 4,789,771 | A | 12/1988 | Robinson et al. |
| 4,790,262 | A | 12/1988 | Nakayama et al. |
| 4,860,687 | A | 8/1989 | Frijlink |
| 4,911,812 | A | 3/1990 | Kudo et al. |
| 4,923,584 | A | 5/1990 | Bramhall, Jr. et al. |
| 4,949,671 | A | 8/1990 | Davis et al. |
| 4,949,783 | A | 8/1990 | Lakios et al. |
| 4,958,061 | A | 9/1990 | Wakabayashi et al. |
| 5,027,746 | A | 7/1991 | Frijlink |
| 5,033,407 | A | 7/1991 | Mizuno et al. |
| 5,033,538 | A | 7/1991 | Wagner et al. |
| 5,090,900 | A | 2/1992 | Rudolf et al. |
| 5,096,536 | A | 3/1992 | Cathey, Jr. |
| 5,133,284 | A | 7/1992 | Thomas et al. |
| 5,148,714 | A | 9/1992 | McDiarmid |
| 5,155,062 | A | 10/1992 | Coleman |
| 5,156,820 | A | 10/1992 | Wong et al. |
| 5,160,544 | A | 11/1992 | Garg et al. |
| 5,180,000 | A | 1/1993 | Wagner et al. |
| 5,199,483 | A | 4/1993 | Bahng |
| 5,215,619 | A | 6/1993 | Cheng et al. |
| 5,221,403 | A | 6/1993 | Nozawa et al. |
| 5,230,741 | A | 7/1993 | van de Ven et al. |
| 5,238,499 | A | 8/1993 | van de Ven et al. |
| 5,248,370 | A | 9/1993 | Tsui et al. |
| 5,267,607 | A | 12/1993 | Wada |
| 5,287,914 | A | 2/1994 | Hughes |
| 5,290,381 | A | 3/1994 | Nozawa et al. |
| 5,292,393 | A | 3/1994 | Maydan et al. |
| 5,298,465 | A | 3/1994 | Levy |
| 5,308,645 | A | 5/1994 | Zachman et al. |
| 5,318,634 | A | 6/1994 | deBoer et al. |
| 5,320,982 | A | 6/1994 | Tsubone et al. |
| 5,322,565 | A | 6/1994 | Zachman et al. |
| 5,332,442 | A | 7/1994 | Kubodera et al. |
| 5,338,363 | A * | 8/1994 | Kawata et al. ............. 118/725 |
| 5,343,012 | A | 8/1994 | Hardy et al. |
| 5,343,938 | A | 9/1994 | Schmidt |
| 5,350,479 | A | 9/1994 | Collins et al. |
| 5,352,294 | A | 10/1994 | White et al. |
| 5,354,382 | A | 10/1994 | Sung et al. |
| 5,356,476 | A | 10/1994 | Foster et al. |
| 5,370,739 | A | 12/1994 | Foster et al. |
| 5,382,311 | A | 1/1995 | Ishikawa et al. |
| 5,383,971 | A | 1/1995 | Selbrede |
| 5,387,289 | A | 2/1995 | Schmitz et al. |
| 5,393,349 | A | 2/1995 | Ohkase |
| 5,403,401 | A | 4/1995 | Haafkens et al. |
| 5,445,677 | A | 8/1995 | Kawata et al. |
| 5,446,824 | A | 8/1995 | Moslehi |
| 5,456,757 | A | 10/1995 | Aruga et al. |
| 5,458,687 | A | 10/1995 | Shichida et al. |
| 5,462,603 | A | 10/1995 | Murakami |
| 5,467,220 | A | 11/1995 | Xu |
| 5,484,011 | A | 1/1996 | Tepman et al. |
| 5,522,131 | A | 6/1996 | Steger |
| 5,574,247 | A * | 11/1996 | Nishitani et al. ............. 118/708 |
| 5,645,646 | A | 7/1997 | Beinglass et al. |
| 5,656,093 | A | 8/1997 | Burkhart et al. |
| 5,685,906 | A | 11/1997 | Dietze et al. |
| 5,738,165 | A | 4/1998 | Imai |
| 5,811,022 | A | 9/1998 | Savas et al. |
| 5,963,840 | A | 10/1999 | Xia et al. |
| 6,113,702 | A | 9/2000 | Halpin et al. |
| 6,174,377 | B1 | 1/2001 | Doering et al. |
| 6,230,654 | B1 | 5/2001 | McNeil |
| 6,268,288 | B1 | 7/2001 | Hautala et al. |
| 6,539,891 | B1 | 4/2003 | Lee et al. |
| 6,551,447 | B1 | 4/2003 | Savas et al. |
| 6,740,247 | B1 | 5/2004 | Han et al. |
| 6,756,318 | B2 | 6/2004 | Nguyen et al. |
| 6,764,546 | B2 | 7/2004 | Raaijmakers |
| 7,138,336 | B2 | 11/2006 | Lee et al. |
| 2002/0129768 | A1* | 9/2002 | Carpenter et al. ............. 118/715 |
| 2006/0137608 | A1 | 6/2006 | Choi et al. |

FOREIGN PATENT DOCUMENTS

| | | |
|---|---|---|
| EP | 0 592 017 | 4/1994 |
| EP | 0 651 424 | 5/1995 |
| EP | 0 657 918 | 6/1995 |
| GB | 2 181 458 | 4/1987 |
| KR | 10-1999-0011877 | 4/2000 |

\* cited by examiner

DEPOSITION APPARATUS

CROSS-REFERENCE TO RELATED APPLICATIONS

The present application is a divisional of U.S. application Ser. No. 12/334,135, filed Dec. 12, 2008 and issued as U.S. Pat. No. 8,092,606 and claims priority to and the benefit of Korean Patent Application No. 10-2007-0133428 filed in the Korean Industrial Property Office on Dec. 18, 2007. The disclosures of each of the priority applications are incorporated by reference herein.

BACKGROUND

1. Field of the Invention

The present invention relates to a deposition apparatus. More particularly, the present invention relates to a deposition apparatus for preventing undesired deposition on the back side of a substrate.

2. Description of the Related Art

In manufacturing semiconductor devices, various apparatuses and processes have been developed to provide a high quality thin film on a substrate. Several methods have been used to form a thin film, employing surface reaction of a semiconductor substrate. The methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE). ALE was studied extensively for semiconductor deposition and electroluminescent display applications, and has been more recently referred to as Atomic Layer Deposition (ALD) for the deposition of a variety of materials.

In deposition apparatuses, it is desirable to prevent reactants from being deposited at an undesired portion of a substrate. For example, if reactant gases enter a space between a substrate and a substrate support in a reaction chamber, an undesired film or impurity particles may be deposited on a back side of the substrate. Such an undesired film or impurity particles may contaminate the reaction chamber, adversely affecting the quality of a thin film deposited on the substrate and the productivity of the deposition apparatus. Thus, there is a need for preventing formation of such an undesired film or impurity particles. Particularly, there is a need for preventing such problems when depositing a metal, such as copper (Cu), ruthenium (Ru), platinum (Pt), or the like.

Figure 1:
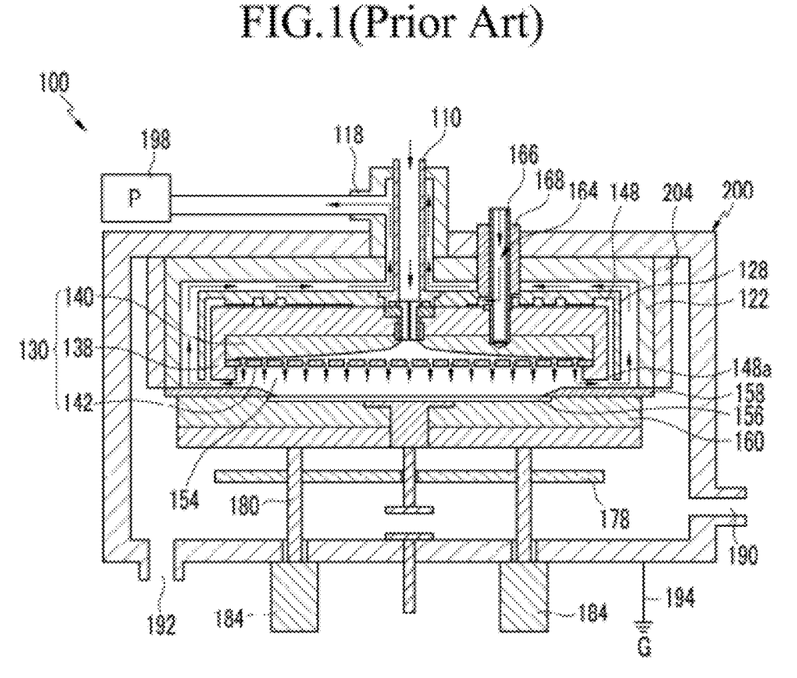
FIG. 1 is a schematic cross-sectional view of a conventional deposition apparatus.

For preventing the formation of an undesired film or impurity particles, a conventional deposition apparatus includes a gas blocking member that blocks edges of a substrate, such that the edges of the substrate are not exposed to reactant gases. FIG. 1 is a schematic cross-sectional view of a conventional deposition apparatus 100 disclosed in U.S. Pat. No. 7,138,336, the disclosure of which is incorporated by reference. Referring to FIG. 1, the deposition apparatus 100 includes a substrate support 160 and a reactor wall 122 forming a reactor chamber. The reactor wall 122 is surrounded by a heater 204. A substrate 156 is mounted on the substrate support 160 during a deposition process.

The deposition apparatus 100 also includes a gas inflow tube 110, a gas outlet tube 118, a plasma generation barrier 128, a showerhead assembly 130, a showerhead insulating wall 138, an inert gas passage 148, a gas sealer ring 158, a substrate support 160, a radio frequency (RF) connecting terminal 166, an insulation tube 168, a vacuum pump 198, and a reactor body 200. The deposition apparatus 100 further includes a girding plate 178, drive shafts 180, pneumatic cylinders 184, an inert gas inlet tube 190, and an inert gas outlet tube 192. The reactor body 200 is connected to ground 194.

The gas inflow tube 110 serves as a conduit for supplying a plurality of reactant gases into the reaction chamber. The gas inflow tube 110 is positioned in the upper part of the reactor wall 122.

The showerhead assembly 130 is positioned inside the reactor wall 122, defining a reaction space 154 together with the substrate support 160. The illustrated showerhead assembly 130 includes a volume adjusting horn 140 and a showerhead plate 142. The volume adjusting horn 140 and the showerhead plate 142 may be formed of a conductive material, such as a metal. The volume adjusting horn 140 is in fluid communication with the gas inflow tube 110. The volume adjusting horn 140 provides gases from the gas inflow tube 110 to the showerhead plate 142. The showerhead plate 142 includes a plurality of gas dispersion holes for distributing the gases into the reaction space 154. The showerhead assembly 130 may be electrically connected to the radio frequency (RF) connection terminal 166. The showerhead insulating wall 138 covers side and top portions of the showerhead assembly 130 to electrically insulate the showerhead assembly 130.

The radio frequency connecting terminal 166 serves to receive radio frequency (RF) power from an external power source. The radio frequency connecting terminal 166 may include an inner tube 164 formed of a conductive material. The inner tube 164 is formed through the reactor body 200, the reactor wall 122, the plasma generation barrier 128, and the showerhead insulation wall 138, and electrically contacts the volume adjusting horn 140. The inner tube 164 is electrically connected to both the volume adjusting horn 140 and the showerhead plate 142, providing a positive (+) polarity to them.

The insulation tube 168, which is formed of an insulating material, surrounds the inner tube 164. The insulating tube 168 electrically insulates the inner tube 164 from the reactor body 200, the reactor wall 122, and the plasma generation barrier wall 128, which may be formed of a conductive material. The insulation tube 168 does not include a portion interposed between the inner tube 164 and the showerhead insulating wall 138 because the showerhead insulating wall 138 is formed of an insulating material. The plasma generation barrier wall 128 is interposed between the showerhead insulation wall 138 and the reactor wall 122 in order to prevent an electrical short through the showerhead assembly 130.

The gas sealer ring 158 is located on the top surface of a periphery of the substrate support 160. The gas sealer ring 158 includes a portion that contacts the bottom surface of the reactor wall 152. The gas sealer ring 158 is in a form of a thin flat washer with a beveled inner side and a square-edged outer side, and seals a gap between the substrate support 160 and the reactor wall 122. The gas sealer ring 158 may be formed of a material having a relatively low thermal expansion coefficient at a process temperature. For example, the gas sealer ring 158 may be formed of a ceramic material having excellent heat resistance. The gas sealer ring 158 may cover a top surface of the periphery of the substrate support 160. This gas sealer ring 158 prevents reactant gases from leaking, and protects the substrate support 160 from being exposed to the reactant gases. The gas sealer ring 158 will be described below in more detail with reference to FIG. 2.

For a deposition process, the substrate 156 is loaded onto the substrate support 160 in the deposition apparatus 100. The reaction chamber is defined by contacting the reactor wall 122 with the substrate support 160. The gas sealer ring 158 contacts and covers the edges of the substrate 156. The gas sealer ring 158 prevents the edges of the substrate 156 from being exposed to reactant gases such that the reactant gases do not flow to the back side of the substrate through the reactor wall 122 and the substrate support 160. Accordingly, substantially no undesired film and impurity particles may be formed on the back side of the substrate 156.

During the deposition process, an inert gas, such as argon (Ar), is supplied through the inner tube 164 of the radio frequency connection terminal 166. Then, the inert gas continues to flow through the inert gas passage 148 between the showerhead insulation wall 138 and the plasma generation barrier wall 128. The inert gas turns around the end part 148a of the inert gas passage 148, and joins the exhaust flow through a gap between the plasma generation barrier wall 128 and the reactor wall 122, and then eventually through the gas outlet tube 118. The inert gas is then exhausted through the vacuum pump 198. In certain instances, the inert gas may be supplied continuously during a deposition process. Such a continuous supply of the inert gas may block the exposure of the top and side portions of the showerhead insulation wall 138 to reactant gases, thereby preventing undesired deposition of a reactant material on the surface of the showerhead insulation wall 138.

Figure 2:
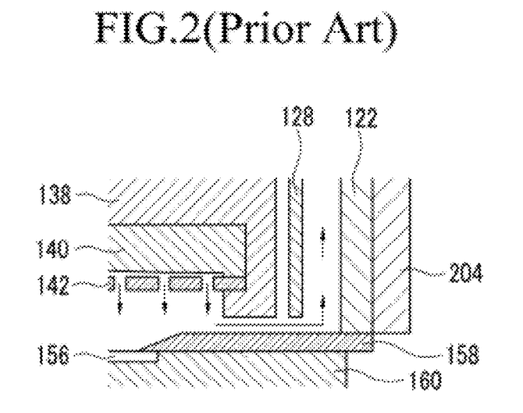
FIG. 2 is a cross-sectional view of a portion of the deposition apparatus of FIG. 1.

Referring to FIG. 2, the deposition apparatus includes the gas sealer ring 158 covering peripheral portions of the substrate 156. The gas sealer ring 158 has a planar ring shape partially overlying the peripheral portions of the substrate 156. However, because the gas sealer ring 158 contacts the substrate 156 during processing, a heat loss may occur through the peripheral portions of the substrate 156 which the gas sealer ring 158 contacts. Accordingly, temperature distribution across the substrate 156 may be non-uniform, adversely affecting the uniformity of a thin film deposited on the substrate 156.

The above information disclosed in this Background section is only for enhancement of understanding of the background of the invention and therefore it may contain information that does not form prior art already known in this country to a person of ordinary skill in the art.

SUMMARY

In one embodiment, a deposition apparatus includes a reactor wall and a substrate support positioned under the reactor wall. The substrate support is configured to support a substrate. The apparatus further includes a reaction space defined over the substrate support; and one or more gas conduits configured to open to a periphery of the reaction space at least while an inert gas is supplied therethrough. The one or more gas conduits are configured to supply the inert gas inwardly toward the substrate around the periphery of the substrate support. The inert gas exits outwardly soon after passing over the periphery of the substrate.

In another embodiment, a method of depositing a film on a substrate includes: loading a substrate onto a substrate support in a reaction space; and supplying an inert gas inwardly toward the substrate around the periphery of the substrate. The inert gas exits outwardly soon after passing over the periphery of the substrate. The method further includes conducting one or more deposition cycles. At least one of the cycles includes: supplying one or more reactant gases substantially vertically from over the substrate while supplying the inert gas.

DETAILED DESCRIPTION OF EMBODIMENTS

Hereinafter, exemplary embodiments of the invention will be described in detail with reference to the attached drawings such that the invention can be easily put into practice by those skilled in the art. The invention can be embodied in various forms, but is not limited to the embodiments described herein. In the drawings, certain dimensions are enlarged for the purpose of clearly illustrating layers and areas, such that the drawings are not to scale. In addition, like elements are denoted by like reference numerals throughout the specification.

As described above, in a deposition apparatus, there is a need for preventing formation of an undesired film or impurity particles on a substrate. There is also a need for preventing non-uniform temperature distribution across a substrate due to a heat loss from the substrate to a part of the deposition apparatus. A heat sink, such as the gas sealer ring 158 of FIGS. 1 and 2, can create temperature gradients across the substrate, and thus non-uniform processing.

In one embodiment, a deposition apparatus includes: a reactor wall; a substrate support positioned under the reactor wall; and a showerhead plate positioned above the substrate support. The showerhead plate defines a reaction space together with the substrate support. A substrate is mounted on the substrate support during a deposition process.

The apparatus also includes one or more gas conduits configured to open to the periphery of the reaction space at least while an inert gas is supplied therethrough. The one or more gas conduits are configured to supply the inert gas inwardly toward the substrate around the periphery of the substrate. The term "periphery of a substrate" may refer to an annular area less than or equal to the exclusion zone of the substrate (e.g., a peripheral region of a substrate of less than about 5 mm from the edge of the substrate or, for more advanced fabrication, of less than about 2 mm from the edge).

In some embodiments, the one or more gas conduits are defined by a gas blocking clamp that surrounds the reaction space. The gas blocking clamp is vertically freely movable by a flow of the inert gas. The gas blocking clamp defines an opening that opens to the periphery of the substrate, when moved up by the inert gas, while being spaced apart from the substrate. This configuration prevents deposition of reactant gases on the back side of the substrate while minimizing a heat loss from the substrate.

Figure 3A:
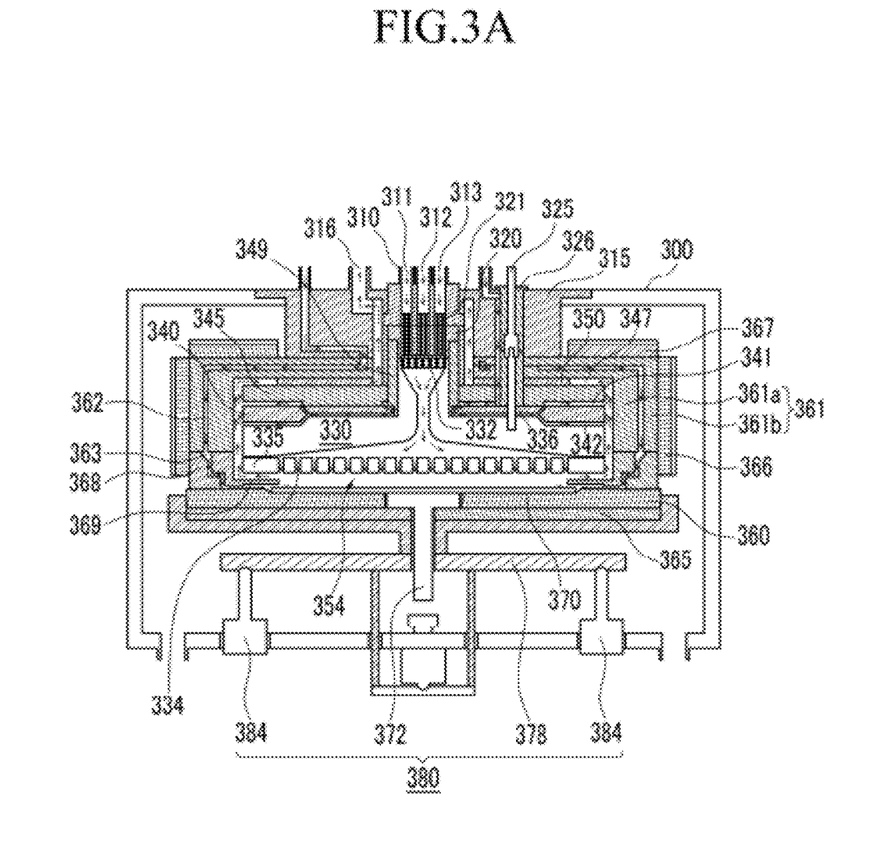
FIG. 3A is a schematic cross-sectional view of a deposition apparatus according to one embodiment.

Referring to FIG. 3A, a deposition apparatus according to one embodiment will be described below. The deposition apparatus may be used for atomic layer deposition or chemical vapor deposition. The illustrated deposition apparatus includes an outer apparatus wall 300, a gas manifold 315, a gas inflow tube 310, a gas outlet 316, an electrically conductive micro-feeding tube sub-assembly 321, an insulating micro-feeding tube sub-assembly 320, a helical flow inducing plate 332, a reaction chamber wall 361, heaters 366 and 367, a gas dispersion assembly 330 and 335, a metallic RF connection port 325 for generating plasma, a substrate support 360, a substrate support driver 380, a gas flow guiding plate 345, a gas dispersion assembly insulating plate 340, a gas dispersion assembly insulating pipe 349, pads 350 and 336, and gas blocking members 368 and 369. The gas dispersion assembly may include a volume adjusting horn 330 and a showerhead plate 335. A substrate 370 is processed in a reaction space 354 defined by the gas dispersion assembly 330, 335 and the substrate support 360. The reaction chamber wall 361, the gas blocking members 368 and 369, and the substrate support 360 may form a reaction chamber.

The gas inflow tube 310 may include a plurality of gas inlets 311, 312, and 313 for supplying a plurality of reactant gases. The gas inlets 311, 312, and 313 are separated from one another. The plurality of gas inlets 311, 312, and 313 are positioned at the central portion of the gas manifold 315. The electrically conductive micro-feeding tube sub-assembly 321 may include a plurality of fine tubules disposed under and downstream of the gas inflow tube 310. The insulating micro-feeding tube sub-assembly 320 may include a plurality of fine tubules that have the same geometries as those of the electrically conductive micro-feeding tube sub-assembly 321. The insulating micro-feeding tube sub-assembly 320 is disposed under and downstream of the electrically conductive micro-feeding tube sub-assembly 321. The fine tubules of the electrically conductive micro-feeding tube sub-assembly 321 and the insulating micro-feeding tube sub-assembly 320 are aligned with each other. Each of the fine tubules may have a diameter from about 0.1 mm to about 1.2 mm.

The helical flow inducing plate 332 is disposed under and apart from the insulating micro-feeding tube sub-assembly 320. The helical flow inducing plate 332 is formed of a conductive material and is electrically and mechanically connected to the volume adjusting horn 330 of the gas dispersion assembly.

The volume adjusting horn 330 of the gas dispersion assembly has an inner shape that broadens toward the showerhead plate 335. The volume adjusting horn 330 has a trumpet shape or a conical shape of which the upper end matches the diameter of the helical flow inducing plate 332. At the downstream of the volume adjusting horn 330, the internal passage first narrows and then widens to the lower end matching the showerhead plate 335, which has a larger diameter than the diameter of the substrate 370. The shape of the volume adjusting horn 330 allows reactant gases to be distributed uniformly, evenly, and smoothly over the substrate 370. The volume adjusting horn 330 also minimizes the volume of the inner part of the gas dispersion assembly 330 and 335.

The showerhead plate 335 of the gas dispersion assembly is disposed above the substrate 370 substantially parallel to the top surface of the substrate. The showerhead plate 335 and the substrate support 360 define a reaction space 354 therebetween. The showerhead plate 335 includes a plurality of through-holes 334 providing fluid communication between the volume adjusting horn 330 and the reaction space 354.

The gas dispersion assembly is electrically connected to the metallic RF connection port 325. The RF connection port 325 may include a bar-shaped metal. The RF connection port 325 functions to apply RF power generated by an external RF power generator (not shown) to the gas dispersion assembly 330, 335. The RF connection port 325 is surrounded by a covering insulating member 326 to avoid short-circuit with other neighboring parts.

In order to maintain electrical insulation of the gas dispersion assembly 330, 335, the gas dispersion assembly insulating plate 340 is disposed on an upper surface of the volume adjusting horn 330. The gas dispersion assembly insulating pipe 349 is disposed at the center of the gas dispersion assembly insulating plate 340.

The gas flow guiding plate 345 is disposed on the gas dispersion assembly insulating plate 340 to provide passages 347 and 341 for purge and reactant gases. The pads 350 are disposed on the flow guiding plate 345 to define a guiding plate upper gap that defines one of the passages 347. Similarly, a plurality of the pads 336 are symmetrically disposed on the volume adjusting horn 330 to define an insulating plate lower gap 342 between the volume adjusting horn 330 and the gas dispersion assembly insulating plate 340.

The substrate support 360 serves to support the substrate 370 during a deposition process. The substrate support 360 may include a heating plate 365 to increase the temperature of the substrate to a desired process temperature.

The reaction chamber wall 361 may include double walls. The double walls may include an inner wall 361a and an outer wall 361b. The inner wall 361a is spaced apart from the outer wall 361b to define one or more inner-chamber-wall gas passage(s) 362 between the inner wall 361a and the outer wall 361b.

In order to maintain a suitable inner temperature of the reaction chamber, the separate heaters 366 and 367 are provided to outer surfaces of the reaction chamber wall 361. In order to prevent a loss of heat generated by the heaters 366 and 367 to the outer apparatus wall 300, the reaction chamber wall 361 has a minimum heat conduction path to the outer apparatus wall 300, i.e., it is fixed to the outer apparatus wall 300 through the flanged cylinder-type gas manifold 315. Due to such a structure, even though the inner temperature of the reaction chamber is, for example, about 300° C., the temperature of the outer apparatus wall 300 can be maintained at about 65° C. or below. Additional heaters (not shown) may be attached to the gas manifold 315 or inserted into the gas manifold 315.

The substrate support driver 380 serves to vertically move the substrate support 360. The substrate support driver 380 may include a central supporting pin 372 for supporting the substrate support 360 and a moving plate 378 linked to pneumatic cylinders 384. The pneumatic cylinders 384 may be fixed to a lower portion of the outer apparatus wall 300 of the deposition apparatus.

The gas blocking members 368 and 369 serve to prevent undesired deposition on the backside of the substrate 370. The gas blocking members 368 and 369 include a gas blocking clamp rim 368 and a gas blocking clamp 369.

Figure 3B:
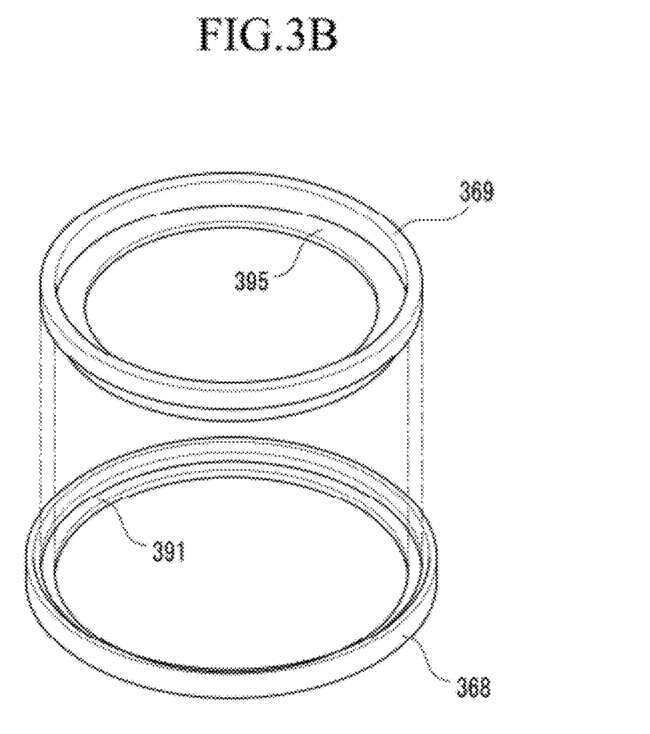
FIG. 3B is a schematic perspective view of a gas blocking clamp and a gas blocking clamp rim according to one embodiment.
Figure 4A:
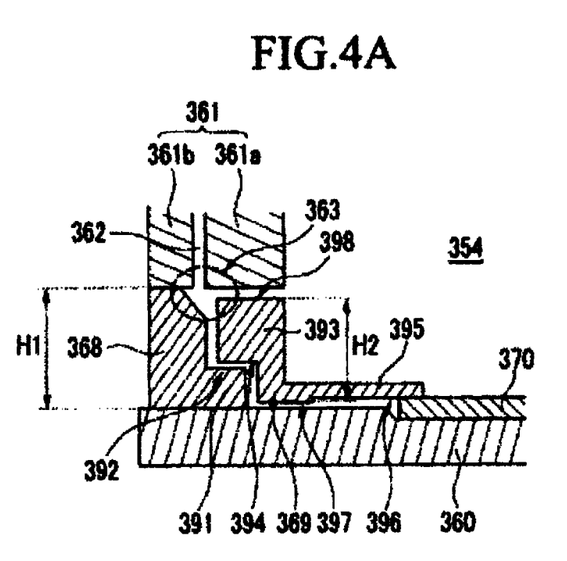
FIG. 4A is a cross-sectional view of a portion of the deposition apparatus of FIGS. 3A and 3B before a deposition process.

The gas blocking clamp rim 368 is positioned on the periphery of the substrate support 360 between the substrate support 360 and the outer wall 361b. In the illustrated embodiment, a top surface of the gas blocking clamp rim 368 is fixed to a bottom surface of the outer wall 361. When viewed from above, the gas blocking clamp rim 368 has a shape similar to that of the outer wall 361b of the reaction chamber, that is, the gas blocking clamp rim 368 has an annular or ring shape surrounding the reaction space 354, as shown in FIG. 3B. With reference to FIGS. 3B and 4A, the gas blocking clamp rim 368 includes an inner flange 391 that has a substantially flat annular top surface 392.

The gas blocking clamp 369 is positioned over the periphery of the substrate support 360, and is laterally surrounded by the gas blocking clamp rim 368. The gas blocking clamp 369 is interposed between the inner wall 361a and the substrate support 360. Referring to FIG. 3B, the illustrated gas blocking clamp 369 has a ring shape partially covering the periphery of the substrate 370. Referring to FIG. 4A, the gas blocking clamp 369 includes an outer flange 393 and an inner flange 395. The outer flange 393 includes a substantially flat and annular bottom surface 394. The inner flange 395 includes a substantially flat annular bottom surface 396.

With reference to FIG. 4A, a height H2 of the gas blocking clamp 369 is smaller than the height H1 of the gas blocking clamp rim 368. The height of the gas blocking clamp 369 is smaller than that of the gas blocking clamp rim 368 by, for example, about 0.1 mm to about 5 mm. A groove is formed along the upper edge of the gas blocking clamp rim 368 to form a gas flow buffering channel 363. As shown, the groove may be configured to facilitate the inert gas to flow through a gap between the gas blocking clamp 369 and the gas blocking clamp rim 368, rather than a gap between the gas blocking clamp 369 and the inner wall 361a of the reaction chamber wall.

Before a deposition process, the substrate support 360 is moved down to open the reaction chamber. When the reaction chamber is opened, the central supporting pin 372 may be lifted up, and then the substrate 370 may be placed on the central supporting pin 372. Then, the central supporting pin 372 may be moved down so that the substrate 370 can be mounted on the substrate support 360.

Then, the substrate support 360 is lifted up by the pneumatic cylinders 384 to contact the gas blocking clamp rim 368 with the gas blocking clamp rim 368 interposed between the substrate support 360 and the reaction chamber wall 361. Thus, the reaction chamber is closed, defining the reaction space 354 therein.

In the illustrated embodiment, the gas blocking clamp 369 may be vertically freely movable between an upper vertical level and a lower vertical level. When there is no substrate on the substrate support 360 or when the substrate support 360 is separated from the gas blocking clamp rim 368, the gas blocking clamp 369 rests on the gas blocking clamp rim 368. In the illustrated embodiment, the bottom surface 394 of the outer flange 393 of the gas blocking clamp 369 rests on the top surface 392 of the inner flange 391 of the gas blocking clamp rim 368. When the substrate support 360 contacts the gas blocking clamp rim 368 with no substrate on the substrate support 360, a lowermost surface 397 of the gas blocking clamp 369 may contact the substrate support 360.

As shown in FIG. 4A, when the substrate support 360 contacts the gas blocking clamp rim 368 with a substrate 370 on the substrate support 360, the bottom surface 396 of the inner flange 395 of the gas blocking clamp 369 rests on the periphery of the substrate 370 if no inert gas is supplied through a gap between the inner and outer walls 361a, 361b. In such an instance, the lowermost surface 397 of the gas blocking clamp 369 may be spaced apart from the substrate support 360. In addition, an uppermost surface 398 of the gas blocking clamp 369 may be spaced apart from the inner wall 361a by a gap substantially equal to a height difference between the gas blocking clamp 369 and the gas blocking clamp rim 368 less a distance between the lowermost surface 397 of the gas blocking clamp 369 and the substrate support 360.

Figure 4B:
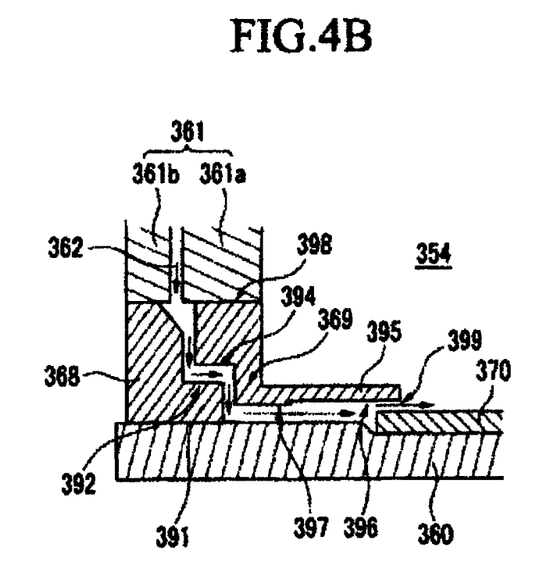
FIG. 4B is a cross-sectional view of a portion of the deposition apparatus of FIGS. 3A and 3B during a deposition process.

Referring to FIG. 4B, during a deposition process, the substrate support 360 contacts the gas blocking clamp rim 368 with a substrate 370 on the substrate support 360. An inert gas flows through the passage(s) 362 between the inner wall 361a and the outer wall 361b of the reaction chamber wall 361. The inert gas passes through a gap between the gas blocking clamp 369 and the gas blocking clamp rim 368, and then under the gas blocking clamp 369 through a space between the gas blocking clamp 369 and the peripheral portions of the substrate support 360. The shape of the components defining the gas flow buffering channel 363 guides the gas under the gas blocking clamp 369 and also, if necessary, spreads the flow from the passage(s) 362. A gas pressure of the inert gas lifts the gas blocking clamp 369 from the substrate support 360 and the periphery of the substrate 370. Thus, the inner flange 395 of the gas blocking clamp 369 is lifted up away from the periphery of the substrate 370, defining an opening 399 that opens to the periphery of the substrate 370.

In the illustrated embodiment, a single annular gas conduit is defined around the reaction chamber. The single annular conduit may be defined partially by a single annular passage between the inner wall 361a and the outer wall 361b. The single annular conduit may be further defined by the gap between the gas blocking clamp 369 and the gas blocking clamp rim 368, the gap between the gas blocking clamp 369 and the peripheral portions of the substrate support 360, and the space between the gas blocking clamp 369 and the periphery of the substrate 370 (when the gas blocking clamp 369 is moved upward). The gas conduit includes a single annular opening that opens to the periphery of the reaction space 354. The gas conduit supplies the inert gas horizontally and inwardly toward the substrate around the periphery of the substrate 370, preferably toward all sides of the reaction space. The inert gas flows over the periphery of the substrate 370 and joins the exhaust gases that flow through a gap between the gas blocking clamp 369 and the showerhead plate 335. The flow of the exhaust gases may be in the opposite direction from that of the flow of the inert gas. The inert gas may not reach the middle of the substrate 370.

In some embodiments, the reaction chamber may be provided with two or more separate gas passages 362 through the reaction chamber wall 361, instead of a single annular passage of FIG. 3A. For example, the inner wall 361a and the outer wall 361b may together define two or more separate passages 362 extending to the gap between the gas blocking clamp 369 and the gas blocking clamp rim 368.

In one embodiment, inert gas flows through the two or more passages 362 may be combined at the gas flow buffering channel 363 to provide a single annular inward flow toward the periphery of the substrate through a single annular gap between the gas blocking clamp 369 and the gas blocking clamp rim 368. In another embodiment, the gas blocking clamp 369 and the gas blocking clamp rim 368 may together define the same number of channels as the number of the passages 362 defined by the inner wall 361a and the outer wall 361b. In yet another embodiment, the gas blocking clamp 369 and the gas blocking clamp rim 368 may together define a plurality of channels, and the number of the channels defined by the gas blocking clamp 369 and the gas blocking clamp rim 368 may be different from the number of the passages 362 defined by the inner wall 361a and the outer wall 361b. In these embodiments, the gas blocking clamp 369 may include an inner flange that defines a substantially annular single opening together with the substrate support 360 such that an annular inward flow of the inert gas is provided to the periphery of the substrate 370.

In certain embodiments, one or more gas conduits defined as described above may be provided with one or more openings at the periphery of the reaction space, rather than an annular opening. The one or more gas openings can be positioned such that an inert gas can be supplied in at least two inward directions toward the center of the substrate while providing the inert gas around the periphery of the substrate 370. In one embodiment, two openings can be positioned at opposite sides of the substrate 370. In other embodiments, three, four, six, or eight openings may be annularly arranged at an interval of 120°, 90°, 60°, or 45°, respectively.

In other embodiments, the gas blocking clamp 369 may be mechanically spaced apart from the substrate 370 by mechanically fixing the gas blocking clamp 369 to the lower surface of the reactor inner wall 361a in a manner that allows an inert gas to flow between the gas blocking clamp 369 and the substrate 370 during a deposition process. In such embodiments, the gas blocking clamp 369 may be integrally formed with the reactor inner wall 361a, in which case the gas blocking clamp 369 is not vertically movable.

Referring back to FIG. 3A, flows of reactant gases in the apparatus will be described below in detail. The reactant gases are supplied from reactant gas sources (not shown) through the gas inlets 311, 312, and 313 in the gas inflow tube 310. The reactant gases pass through the electrically conductive micro-feeding tube sub-assembly 321, the insulating micro-feeding tube sub-assembly 320, and the helical flow inducing plate 332. The reactant gas flows are given a horizontal component (generally parallel to the top surface of the substrate 370), and rotated clockwise or counterclockwise while passing through narrow inducing grooves in the lower portion of the helical flow inducing plate 332. The reactant gases are again provided with a flow component vector substantially perpendicular to the substrate 370 when passing from the helical flow inducing plate 332 into the volume adjusting horn 330. These helical flows mix the gases flowing from the inlets 311, 312, and 313 inside the volume adjusting horn 330.

The inner portion of the volume adjusting horn 330 has a shape of a funnel so as to induce a laminar flow and smooth dispersion of the mixed reactant gases. The horn shape also minimizes the inner surface area of the volume adjusting horn 330. The laminar flow and minimized surface area facilitate rapid switching of the reactant gases inside the gas dispersion assembly 330, 335 while still spreading the gases across the width of the showerhead 335. The rapid gas switching allows more ALD cycles per unit time, and thus a higher film growth rate. Together with the helical flow inducing plate 332, the volume adjusting horn 330 produces a uniformly distributed (across the substrate surface) and well-mixed reactant gas (i.e., uniform concentration of reactant and inert gases) during ALD cycles.

Advantageously, the helical flow inducing plate 332 provides swirling action that distributes the reactant gas or gas mixture symmetrically with respect to the downstream gas dispersion structure and the substrate, even though the process gas may be asymmetrically introduced through one of the gas inlets 311, 312, or 313. Additionally, if during one pulse a reactant gas is introduced through one of the gas inlets 311, 312, or 313 and an inert gas is introduced through another of the gas inlets 311, 312, or 313, the swirling action mixes these reactant gases to improve uniformity of the exposure of the substrate to the reactant gas within the mixture. Accordingly, the helical flow inducing plate 332 that is downstream of the separate gas inlets 311, 312, and 313 may provide distribution uniformity, regardless of the particular gas dispersion structure between the plate 332 and the surface of the substrate 370. In addition, the showerhead plate 335 allows for a uniform reactant gas supply to the substrate 370 by passing the gases through the through-holes 334. In certain embodiments, the showerhead plate 335 can be omitted, and the helical flow inducing plate 332 together with the volume adjusting horn 330 may ensure good distribution of reactant gases introduced perpendicularly to the substrate surface.

In the illustrated embodiment, the RF power is applied to the gas dispersion assembly 330, 335 through the RF connection port 325. A plasma may be generated between the substrate support 360 and the showerhead plate 335 to enhance the deposition of a material.

In certain instances, an undesired film may be deposited if the reactant gases flow between the gas dispersion assembly insulating plate 340 and the gas dispersion assembly 330, 335 to which a RF voltage is applied. In addition, an undesired film may deposited on the lower portion of the inner wall 361a of the reaction chamber adjacent to the substrate 370 and the showerhead plate 335 to which the reactant gases are supplied.

In the illustrated embodiment, an inert gas purge is used to prevent such undesirable film deposition. The inert gas is supplied through a gap between the RF connection port 325 and the gas flow guiding plate 345. Examples of inert gases include, but are not limited to, argon (Ar), helium (He), and nitrogen ($N_2$).

The inert gas flows through the insulating plate lower gap 342 between the volume adjusting horn 330 and the gas dispersion assembly insulating plate 340, and the insulating plate upper gap 341 between the gas dispersion assembly insulating plate 340 and the gas flow guiding plate 345. The inert gas passing over the upper and lower surfaces of the gas dispersion assembly insulating plate 340 is combined with excess reactant gases and by-product gases exhausted from the reaction space 354. The combined purge gas and reactant gases pass through a gap between the gas flow guiding plate 345 and the reaction chamber wall 361, and then pass through the guiding plate upper gap 347. The combined gases are then removed through the gas outlet 316. The inert gas continuously flows through the gas passages 341 and 342 along the upper and lower surfaces of the gas dispersion assembly insulating plate 340 to prevent the reactant gases from forming a thin film on the gas dispersion assembly insulating plate 340.

An inert gas is also supplied through the passage(s) 362 between the inner wall 361a and the outer wall 361b of the reaction chamber wall 361. The inert gas flows through a gap between the gas blocking clamp 369 and the gas blocking clamp rim 368. When the inert gas reaches an edge of the substrate, the inert gas lifts up the gas blocking clamp 369, thereby forming a gap between the substrate 370 and the gas blocking clamp 369. The inert gas passes through the gap formed by the lifted gas blocking clamp 369. The inert gas joins the flow of the excess reactant gases and by-product gases, and passes through an exhaust passage defined by a gap between the gas blocking clamp 369 and the periphery of the showerhead plate 335. The inert gas then flows through the guiding plate upper gap 347 to the gas outlet 316.

Referring to FIGS. 4A and 4B, an inert gas flowing between the gas blocking members, including the gas blocking clamp rim 368 and the gas blocking clamp 369, and the substrate 370 will be described in detail. FIG. 4A is a cross-sectional view of a portion of the deposition apparatus according to one embodiment before or after a deposition process. FIG. 4B is a cross-sectional view of a portion of the deposition apparatus during the deposition process.

Referring to FIG. 4A, before a deposition process starts, the substrate support 360 is lifted up such that the substrate support 360 contacts the lower surface of the gas blocking clamp rim 368 to define a reaction space 354. A portion of the lower surface of the gas blocking clamp 369 is spaced apart from the substrate support 360 while another part of the lower surface of the gas blocking clamp 369 contacts and covers the periphery of the substrate 370 on the substrate support 360. As described above, the gas blocking clamp 369 has a height H2 smaller than the height H1 of the gas blocking clamp rim 368 by, for example, about 0.1 mm to about 5 mm. Accordingly, the gas blocking clamp 369 is vertically spaced apart from the inner wall 361a of the reaction chamber. The gas blocking clamp rim 368 and the gas blocking clamp 369 are spaced laterally apart from each other at least by a gap between the inner wall 361a and the outer wall 361b of the reaction chamber.

During the deposition process, an inert gas is supplied through the gas manifold 315 (FIG. 3A), and the inert gas flows through the passage 362 between the inner wall 361a and the outer wall 361b, as shown in FIG. 4B. The inert gas then passes a gap between the gas blocking clamp 369 and the gas blocking clamp rim 368. The gas blocking clamp 369 is lifted up by a gas pressure of the inert gas when the gas pressure is sufficient to move the gas blocking clamp 369 upward. As described above, the gas blocking clamp 369 is lifted up to move away from the substrate support 360 and the substrate 370. The gas blocking clamp 369 can be moved up into contact with the inner wall 361a, e.g., the gas blocking clamp 369 can be moved up by about 0.1 mm to about 5 mm. The inert gas passes through a gap between the gas blocking clamp 369 and the substrate support 360 and then flows through an opening formed between edges of the gas blocking clamp 369 and edges of the substrate 370. In one embodiment, the inert gas may be supplied at a flow rate of about 10 sccm to about 3,000 sccm.

The inert gas supplied through the gap between the gas blocking clamp 369 and the gas blocking clamp rim 368 prevents the reactant gases from flowing to the back side of the substrate 370, by, e.g., about 0.1 mm to about 5 mm, through a space between the substrate 370 and the substrate support 360. Thus, this configuration prevents the reactant gases from forming a film on the back side of the substrate 370.

In addition, the inert gas continuously lifts the gas blocking clamp 369 to be spaced apart from the substrate 370 during the deposition process. Accordingly, a heat loss from the substrate 370 induced by the gas blocking clamp 369 may be prevented. Thus, non-uniform deposition caused by non-uniform heat distribution across the substrate 370 may be prevented.

In the conventional deposition apparatus described above, the gas blocking clamp needs to be formed of a ceramic material having high heat resistance and low deformation against a thermal expansion because the gas blocking clamp contacts the edges of the substrate during processing. In contrast, the gas blocking clamp 369 of the deposition apparatus according to the embodiment may be formed of any other materials, such as a metal, because the gas blocking clamp 369 is spaced apart from the edges of the substrate 370 during the deposition process and the inert gas flows through the gap between them.

During the deposition process with conventional apparatus, an undesired thin film may be deposited on the backside and edges of the substrate, and then the undesired thin film may be detached or peeled off by a mechanical contact and impact required for loading and unloading the substrate 370. Thus, impurity particles may be formed in the reactor. In the deposition apparatus described above, however, the inert gas continuously flows during the deposition process so that such an undesired thin film is not formed.

Examples 1 and 2

Figure 5A:
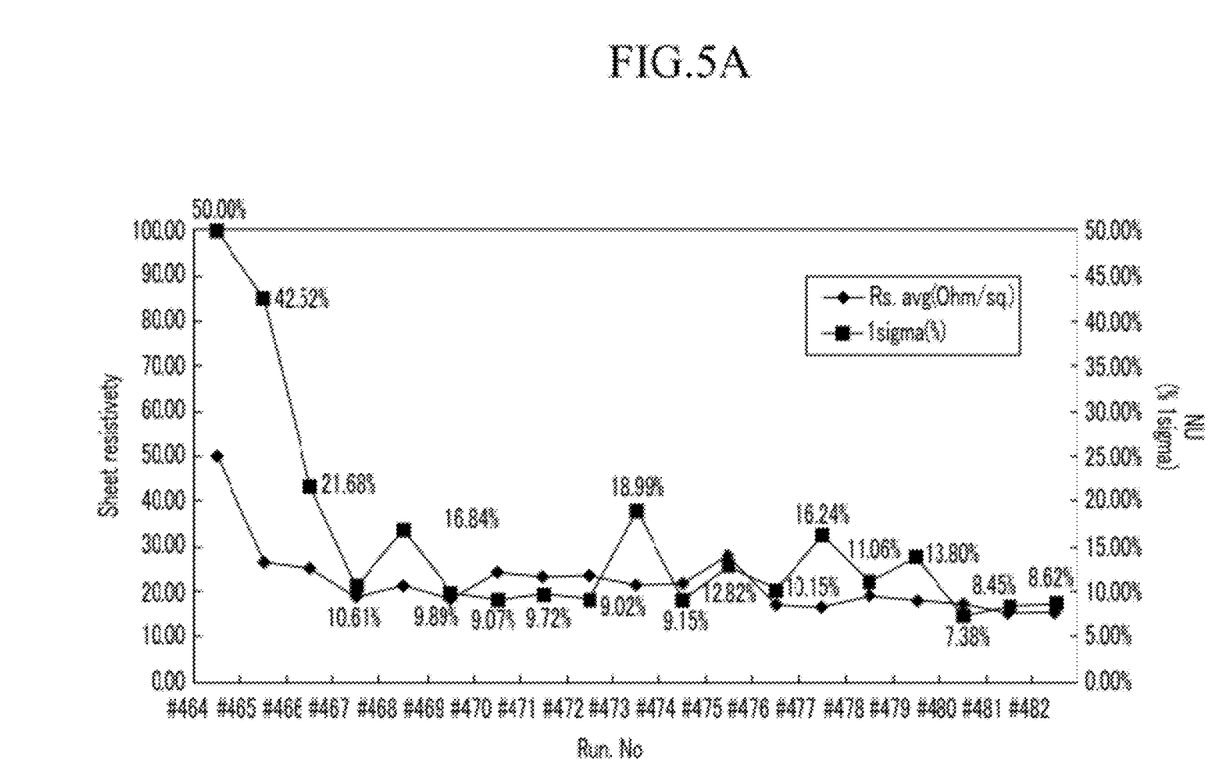
FIG. 5A and FIG. 5B are graphs representing sheet resistance uniformity of ruthenium oxide ($RuO_x$) thin films deposited by using a conventional deposition apparatus and a deposition apparatus according to one embodiment, respectively.
Figure 5B:
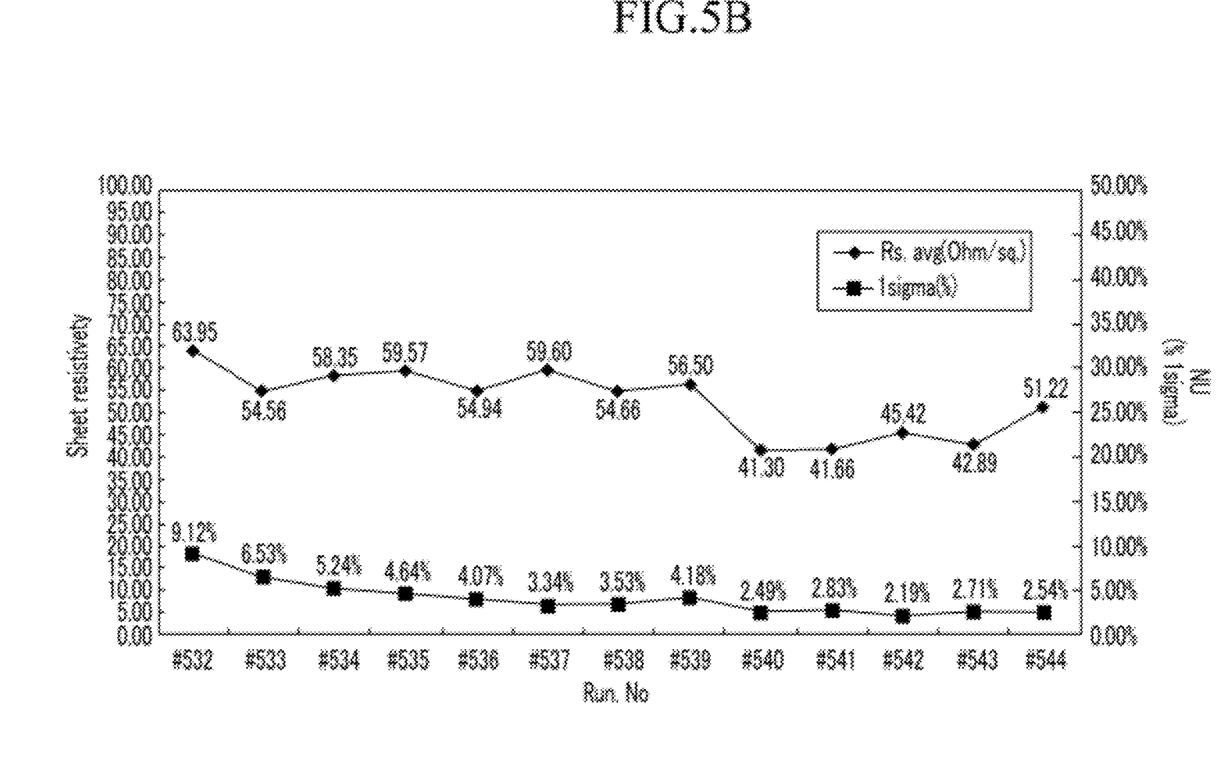

Referring to FIG. 5A and FIG. 5B, properties of a thin film deposited by the deposition apparatuses of FIGS. 1 and 3 will be described below. In Examples 1 and 2, ruthenium oxide (RuOx) thin films were deposited.

In Example 1, the conventional deposition apparatus of FIG. 1 was used. In Example 1, the gas blocking clamp contacted the substrate during the deposition process. In Example 2, the deposition apparatus of FIG. 3 was used. In Example 2, the gas blocking clamp was spaced apart from the substrate. An inert gas was supplied between the gas blocking clamp and the substrate. In the Examples 1 and 2, other deposition conditions were the same as each other.

After depositing the ruthenium oxide thin films, sheet resistances of the ruthenium oxide thin film were measured at 17 different positions on each of the ruthenium oxide thin films. Difference in sheet resistance between the different positions were calculated. The results are shown in FIG. 5A and FIG. 5B. FIG. 5A represents the result from Example 1, and FIG. 5B represents the results from Example 2. FIG. 5A and FIG. 5B are graphs representing sheet resistance uniformity of ruthenium oxide ($RuO_x$) thin films deposited by the deposition apparatuses.

In FIG. 5A, the differences in sheet resistance between the different positions range from 9% to 50%. In contrast, in FIG. 5B, the differences in sheet resistance between the different positions range from 2% to 9%, which is relatively very low compared to the result shown in FIG. 5A. The sheet resistance of the film of Example 2 was relatively higher than the sheet resistance of the film of Example 1 because the film of Example 2 was thinner than the film of Example 1. This was because the deposition rate of Example 2 was relatively lower than that of Example 1, partially due to the inward flow of the inert gas in Example 2. However, the layer from Example 2 had more uniformity than the layer from Example 1.

Examples 3 and 4

Figure 6A:
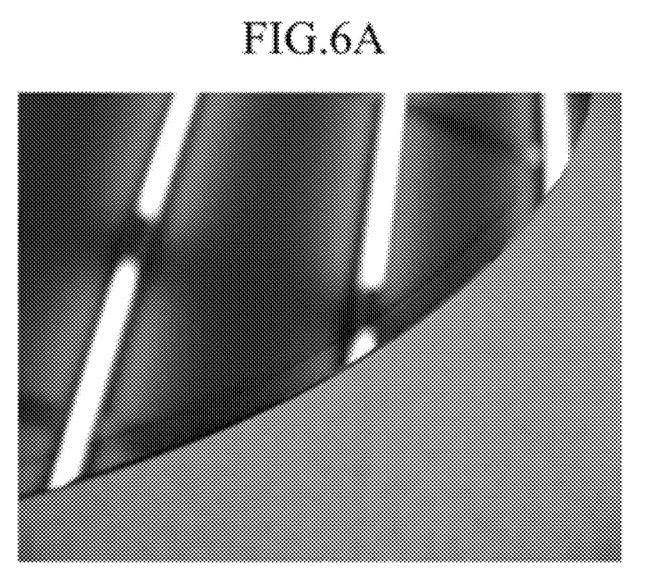
FIG. 6A and FIG. 6B are photographs showing surfaces of ruthenium oxide ($RuO_x$) thin films deposited by using a conventional deposition apparatus and a deposition apparatus according to one embodiment, respectively.
Figure 6B:
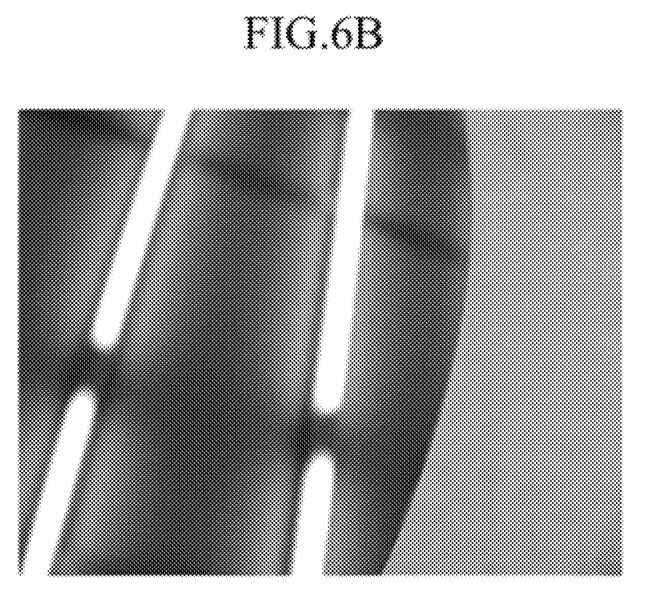

Referring to FIG. 6A and FIG. 6B, uniformity of a thin film deposited by the deposition apparatuses of FIGS. 1 and 3 will be described below. FIG. 6A and FIG. 6B are photographs showing surfaces of ruthenium oxide ($Ruo_x$) thin films deposited by using the deposition apparatuses.

In Examples 3 and 4, thin films were deposited using the deposition apparatuses of FIG. 1 and FIG. 3, respectively. In Example 3, the conventional deposition apparatus of FIG. 1 was used. In Example 3, the gas blocking clamp contacted the substrate during the deposition process. In Example 4, the deposition apparatus of FIG. 3 was used. In Example 4, the gas blocking clamp was spaced apart from the substrate. An inert gas was supplied between the gas blocking clamp and the substrate. In the Examples 3 and 4, other deposition conditions were the same as each other.

After depositing the thin films, the surfaces of the deposited film were photographed. Photographs of the surfaces are shown in FIG. 6A and FIG. 6B. FIG. 6A is a photograph of the film from Example 3, and FIG. 6B is a photograph of the thin film from Example 4.

In FIG. 6A, the surface color of the thin film formed on the edges of the substrate is different from that of the thin film formed on the other regions of the substrate. The color difference is apparent. This indicates that the thickness of the thin film on the edges of the substrate is substantially different from the thin film on the other regions of the substrate.

In contrast, in FIG. 6B, there is a relatively very small difference between the surface colors of the thin film formed on the edges and the thin film on other regions of the substrate. This indicates that the thin film deposited by the deposition apparatus according to the embodiment of the present invention has good thickness uniformity.

As described above, the deposition apparatuses according to the embodiments prevent an undesired thin film and impurity particles from being formed on the back side of the substrate. In addition, a heat loss from the substrate induced by contacting the gas blocking clamp may be prevented, thus preventing non-uniformity that may be caused by non-uniform heat distribution across the substrate. Accordingly, the thickness uniformity of a deposited film may be enhanced, and the productivity of the deposition apparatus can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

We claim:

1. A method of depositing a film on a substrate, the method comprising:
    loading a substrate onto a substrate support in a reaction space, wherein the reaction space includes a blocking member that extends inwardly over and contacts a periphery of the substrate;
    moving the blocking member upward such that a gap is defined between the blocking member and the periphery of the substrate;
a. supplying an inert gas inwardly toward the substrate through the gap between the blocking member and the periphery of the substrate,—wherein supplying the inert gas moves the blocking member upward such that the inert gas flows through the gap and—wherein the inert gas turns outwardly toward an exhaust after passing over the periphery of the substrate; and
    conducting one or more deposition cycles, at least one of the cycles comprising: supplying one or more reactant gases substantially vertically while supplying the inert gas.

2. The method of claim 1, wherein supplying the inert gas comprises supplying the inert gas inwardly in all radial directions.

3. The method of claim 1, wherein the inert gas does not reach the middle of the substrate.

4. The method of claim 3, wherein the blocking member extends up to about 5 mm inwardly over the periphery of the substrate.

5. The method of claim 4, wherein the blocking member extends up to about 2 mm inwardly over the periphery of the substrate.

6. The method of claim 1, wherein supplying the one or more reactant gases comprises supplying the one or more reactant gases through a showerhead plate while conducting the one or more deposition cycles.

7. The method of claim 1, wherein the one or more deposition cycles comprise atomic layer deposition cycles.

8. The method of claim 1, wherein the inert gas flows inwardly between a first side of the blocking member and periphery of the substrate and after turning flow is outwardly past a second side of the blocking member opposing the first side of the blocking member.

9. The method of claim 1, wherein the blocking member floats when the inert gas is supplied.

10. The method of claim 1, wherein the blocking member is integral with the substrate support.

* * * * *

UNITED STATES PATENT AND TRADEMARK OFFICE
CERTIFICATE OF CORRECTION

PATENT NO.         : 8,747,948 B2
APPLICATION NO.    : 13/346470
DATED              : June 10, 2014
INVENTOR(S)        : Hyung Sang Park Page 1 of 1

It is certified that error appears in the above-identified patent and that said Letters Patent is hereby corrected as shown below:

In the Specification

Column 12 line 48, Change "($Ruo_x$)" to --($RuO_x$)--.

In the Claims

Column 13 line 37, Claim 1, change "a. supplying" to --supplying--.

Column 14 line 1, Claim 1, change "substrate,--wherein" to --substrate, wherein--.

Column 14 line 3, Claim 1, change "and--wherein" to --and wherein--.

Signed and Sealed this
Sixteenth Day of December, 2014

Michelle K. Lee
*Deputy Director of the United States Patent and Trademark Office*